United States Patent
Hung et al.

(10) Patent No.: US 11,062,781 B1
(45) Date of Patent: Jul. 13, 2021

(54) EQUALIZER CIRCUIT, MEMORY STORAGE DEVICE AND SIGNAL ADJUSTMENT METHOD

(71) Applicant: PHISON ELECTRONICS CORP., Miaoli (TW)

(72) Inventors: Zhen-Hong Hung, New Taipei (TW); Shih-Yang Sun, Taoyuan (TW); Sheng-Wen Chen, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/916,137

(22) Filed: Jun. 30, 2020

(30) Foreign Application Priority Data

Jun. 17, 2020 (TW) .................................. 109120304

(51) Int. Cl.
*G11C 16/32* (2006.01)
(52) U.S. Cl.
CPC .................................... *G11C 16/32* (2013.01)
(58) Field of Classification Search
CPC .................................................... G11C 16/32
See application file for complete search history.

(56) References Cited

U.S. PATENT DOCUMENTS

| 6,967,514 | B2* | 11/2005 | Kizer | H03K 5/1565 |
| | | | | 327/175 |
| 9,281,971 | B1* | 3/2016 | Edelkhani | H04L 1/242 |
| 2004/0189364 | A1* | 9/2004 | Lee | H03K 5/1565 |
| | | | | 327/175 |
| 2008/0204099 | A1* | 8/2008 | Hur | H03K 5/1565 |
| | | | | 327/175 |
| 2009/0058482 | A1* | 3/2009 | Kim | G11C 7/222 |
| | | | | 327/175 |
| 2009/0146707 | A1* | 6/2009 | Shin | H03L 7/10 |
| | | | | 327/158 |
| 2014/0159789 | A1* | 6/2014 | Ku | H03L 7/0814 |
| | | | | 327/158 |

(Continued)

FOREIGN PATENT DOCUMENTS

TW    I663840    6/2019

OTHER PUBLICATIONS

"Office Action of Taiwan Counterpart Application", dated Dec. 21, 2020, p. 1-p. 6.

*Primary Examiner* — Khamdan N. Alrobaie
(74) *Attorney, Agent, or Firm* — JCIPRNET (57) ABSTRACT

An equalizer circuit, a memory storage device and a signal adjustment method are disclosed. The equalizer circuit is configured to receive an input signal, a reference voltage signal and a sensing clock signal and generate an error signal. The equalizer circuit is further configured to generate a first adjustment signal and a second adjustment signal according to the error signal. The equalizer circuit is further configured to update a control code from a first control code to a second control code according to at least one of the first adjustment signal and the second adjustment signal and generate an adjustment control signal according to the control code. The equalizer circuit is further configured to generate a feedback control signal according to the adjustment control signal to restore the control code from the second control code to the first control code.

21 Claims, 6 Drawing Sheets

(56) References Cited

U.S. PATENT DOCUMENTS

| | | | |
|---|---|---|---|
| 2014/0176206 A1* | 6/2014 | Kim | H03L 7/0816 |
| | | | 327/158 |
| 2014/0203854 A1* | 7/2014 | Jung | H03L 7/0995 |
| | | | 327/158 |
| 2021/0075430 A1* | 3/2021 | Han | H03L 7/087 |

* cited by examiner

EQUALIZER CIRCUIT, MEMORY STORAGE DEVICE AND SIGNAL ADJUSTMENT METHOD

CROSS-REFERENCE TO RELATED APPLICATION

This application claims the priority benefit of Taiwan application no. 109120304, filed on Jun. 17, 2020. The entirety of the above-mentioned patent application is hereby incorporated by reference herein and made a part of this specification.

TECHNICAL FIELD

The invention relates to a signal adjustment technique, and more particularly, to an equalizer circuit, a memory storage device and a signal adjustment method.

BACKGROUND

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

In order to ensure the correctness of data reception, most memory storage devices are disposed with an equalizer to compensate the input signal. In the general equalizer calibration technique, the correction status of the equalizer and/or the quality of the parameters used may be evaluated by evaluating the bit error rate (BER) of the signal output by the equalizer. In addition, the correction status of the equalizer also affects the eye width and/or the eye height of the output signal.

However, the common equalizer does not involve with the eye width detection and/or the eye height detection of the signal. If the eye width and/or eye height of the output signal are to be detected, an eye width detector and/or an eye height detector needs to be additionally disposed, which leads to an increase in the circuit layout area.

SUMMARY

The invention provides an equalizer circuit, a memory storage device and a signal adjustment method, which can allow the equalizer circuit to be converged at a place where a signal error is larger, and then use information measured there for subsequent applications such as the eye height detection and/or the eye wide detection.

An exemplary embodiment of the invention provides an equalizer circuit, which includes a signal receiving circuit, a logic processing circuit, an adjustment control circuit and a timing feedback circuit. The signal receiving circuit is configured to receive an input signal, a reference voltage signal and a sensing clock signal and generate an error signal. The logic processing circuit is coupled to the signal receiving circuit and configured to generate a first adjustment signal and a second adjustment signal according to the error signal. The adjustment control circuit is coupled to the logic processing circuit, and configured to update a control code from a first control code to a second control code according to at least one of the first adjustment signal and the second adjustment signal and generate an adjustment control signal according to the control code. The adjustment control signal is configured to adjust one of the reference voltage signal and the sensing clock signal, and the first control code is different from the second control code. The timing feedback circuit is coupled to the adjustment control circuit and configured to generate a feedback control signal to the adjustment control signal according to the adjustment control signal, so as to instruct the adjustment control circuit to restore the control code from the second control code to the first control code.

An exemplary embodiment of the invention further provides a memory storage device, which includes a connection interface unit, a rewritable non-volatile memory module, a memory control circuit unit and an equalizer circuit. The connection interface unit is configured to couple to a host system. The memory control circuit unit is coupled to the connection interface unit and the rewritable non-volatile memory module. The equalizer circuit is disposed in at least one of the connection interface unit, the rewritable non-volatile memory module and the memory control circuit unit. The equalizer circuit is configured to receive an input signal, a reference voltage signal and a sensing clock signal and generate an error signal. The equalizer circuit is further configured to generate a first adjustment signal and a second adjustment signal according to the error signal. The equalizer circuit is further configured to update a control code from a first control code to a second control code according to at least one of the first adjustment signal and the second adjustment signal and generate an adjustment control signal according to the control code. The adjustment control signal is configured to adjust one of the reference voltage signal and the sensing clock signal, and the first control code is different from the second control code. The equalizer circuit is further configured to generate a feedback control signal according to the adjustment control signal to restore the control code from the second control code to the first control code.

An exemplary embodiment of the invention further provides a signal adjustment method for a memory storage device. The signal adjustment method includes: receiving an input signal, a reference voltage signal and a sensing clock signal and generating an error signal; generating a first adjustment signal and a second adjustment signal according to the error signal; updating a control code from a first control code to a second control code according to at least one of the first adjustment signal and the second adjustment signal and generating an adjustment control signal according to the control code, wherein the adjustment control signal is configured to adjust one of the reference voltage signal and the sensing clock signal, and the first control code is different from the second control code; and generating a feedback control signal according to the adjustment control signal to restore the control code from the second control code to the first control code.

Based on the above, during a convergence process of the equalizer circuit, the feedback control signal is additionally added and used for a timing feedback of the control code generated during the convergence process. Accordingly, the equalizer circuit can stably converge at a place where a signal error is large, and can then use the information measured there for the subsequent application such as the eye height detection and/or the eye wide detection.

DETAILED DESCRIPTION

Embodiments are provided below to describe the present invention in detail, though the invention is not limited to the provided embodiments, and the provided embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

Figure 1:
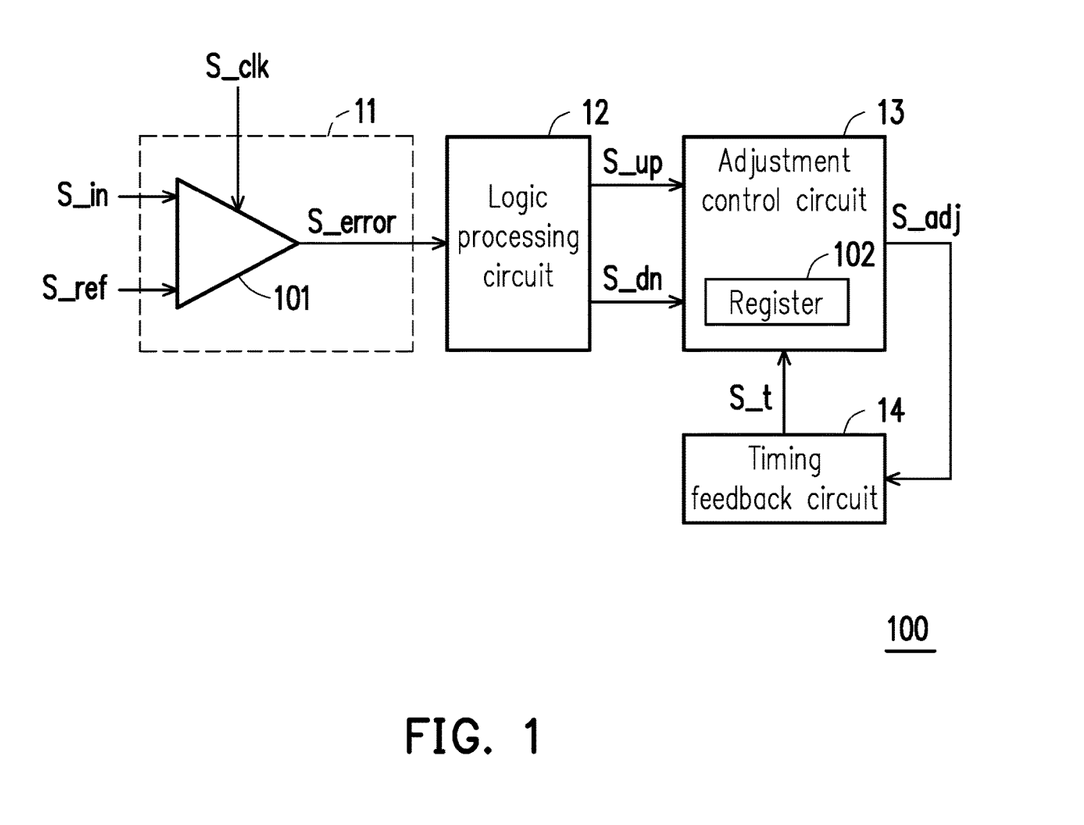
FIG. 1 is a schematic diagram illustrating an equalizer circuit according to an exemplary embodiment of the invention.

FIG. 1 is a schematic diagram illustrating an equalizer circuit according to an exemplary embodiment of the invention. Referring to FIG. 1, in general, when a signal (a.k.a. an input signal) S_in is transmitted from a signal transmitter to a signal receiver, a noise may be generated due to channel interference. This noise will affect a signal quality of the signal S_in at the receiver. For example, an eye width and/or an eye height of the signal S_in may be narrowed to affect a signal analysis performance of the receiver. An equalizer circuit 100 may be disposed at the signal receiver and may modulate and compensate the signal S_in according to different operating parameters to improve the signal quality of the signal S_in (e.g., increase the eye width and/or the eye height of the signal S_in). In addition, according to modulation and compensation results of the signal S_in, the operating parameters used by the equalizer circuit 100 may be changed in an attempt to improve a compensation capability of the equalizer circuit 100 for the signal S_in.

In the following exemplary embodiments, the equalizer circuit 100 adopting the ss LMS (sign-sign Least-Mean-Square) algorithm is used as an example, but the invention is not limited thereto. In other exemplary embodiments, the equalizer circuit 100 may also adopt other types of algorithms, such as se (sign-error) LMS or sd (sign-data) LMS.

The equalizer circuit 100 includes a signal receiving circuit 11, a logic processing circuit 12, an adjustment control circuit 13 and a timing feedback circuit 14. The signal receiving circuit 11 is configured to receive the signal S_in, a signal (a.k.a. a reference voltage signal) S_ref and a signal (a.k.a. a sensing clock signal) S_clk and generate a signal (a.k.a. an error signal) S_error.

In an exemplary embodiment, the signal receiving circuit 11 includes a comparator 101. The comparator 101 may compare the signal S_in with the signal S_ref according to the signal S_clk and generate the signal S_error according to a comparison result. In other words, the signal S_error can reflect a difference between the signals S_in and S_ref (e.g., a voltage difference or a phase difference).

The logic processing circuit 12 is coupled to the signal receiving circuit 11 and configured to generate a signal (a.k.a. a first adjustment signal) S_up and a signal (a.k.a. a second adjustment signal) S_dn according to the signal S_error. Within a preset time range, the generation of the signal S_up and the generation of the signal S_dn are affected by the signal S_error. For example, according to the signal S_error, the logic processing circuit 12 attempts to converge the signal S_error by using the signals S_up and S_dn.

The adjustment control circuit 13 is coupled to the logic processing circuit 12. The adjustment control circuit 13 is configured to receive the signals S_up and S_dn and update a control code according to at least one of the signals S_up and S_dn. For example, the control code may be updated from a current code (a.k.a. a first control code) to a new code (a.k.a. a second control code). The first control code may be different from the second control code. For example, a value of the first control code may be different from a value of the second control code. The adjustment control circuit 13 may generate a signal (a.k.a. an adjustment control signal) S_adj according to the control code. The signal S_adj can reflect the current control code. In an exemplary embodiment, the signal S_adj may be used to adjust one the signals S_ref and S_clk.

In an exemplary embodiment, the signal S_up is configured to increase the control code by one preset value (a.k.a. a first preset value), and the signal S_dn is configured to decrease the control code by one preset value (a.k.a. a second preset value). The first preset value may be identical to or different from the second preset value. It should be noted that in different exemplary embodiments, the value of the first control code may be greater than the value of the second control code or the value of the first control code may be less than the value of the second control code, which is not limited in the invention.

In an exemplary embodiment, the adjustment control circuit 13 includes a register 102. The register 102 may be configured to store the control code. For example, the control code may be a binary value or a decimal value, which is not limited by the invention.

The timing feedback circuit 14 is coupled to the adjustment control circuit 13 and configured to generate a signal (a.k.a. a feedback control signal) S_t according to the signal S_adj. The timing feedback circuit 14 may transmit the signal S_t to the adjustment control circuit 13 to instruct the adjustment control circuit 13 to restore the control code from the second control code to the first control code. In an exemplary embodiment, an operation of restoring the control code from the second control code to the first control code may be referred to as the timing feedback.

In an exemplary embodiment, after the control code is updated from the first control code to the second control code, the adjustment control circuit 13 may receive the signal S_t from the timing feedback circuit 14. According to the signal S_t, the adjustment control circuit 13 may perform the timing feedback on the current control code, so as to restore a value of the control code to a value used a while ago.

In an exemplary embodiment, an operation of updating the control code from the first control code to the second control code according to the signals S_up and/or S_dn (a.k.a. a first operation) may cause the equalizer circuit 100 to be converged to a preset stable state position. At the preset stable state position, a sampling result of the signal S_in by the equalizer circuit 100 will be near a center position (e.g., oscillating near this center position) of a plurality of sampling points of the signal S_in. Therefore, a bit error rate of the signal S_in is usually lower at the preset stable state position. In other words, in an exemplary embodiment, the first operation may be used to decrease the bit error rate of the signal S_in.

In an exemplary embodiment, an operation of restoring the control code from the second control code to the first control code according to the signals S_t (a.k.a. a second operation) may cause the equalizer circuit 100 to leave the preset stable state position and be converged to a new stable state position. At the new stable state position, the bit error rate of the signal S_in is increased. In other words, in an exemplary embodiment, the second operation (or the timing feedback) may increase the bit error rate of the signal S_in.

Figure 2:
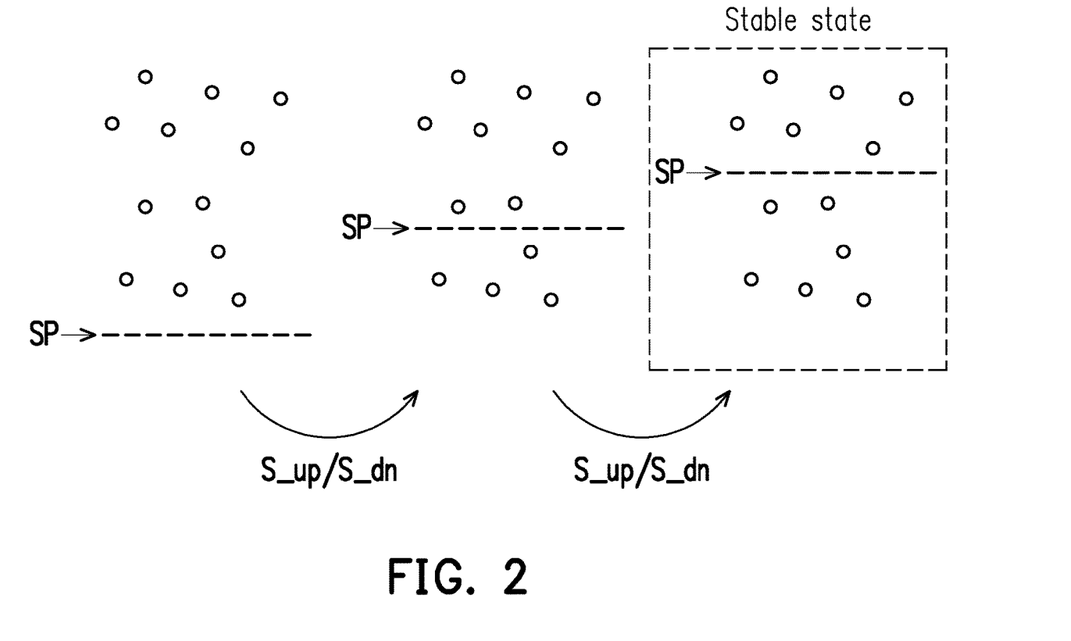
FIG. 2 is a schematic diagram illustrating the equalizer circuit converged to a preset stable state position according to an exemplary embodiment of the invention.

FIG. 2 is a schematic diagram illustrating the equalizer circuit converged to a preset stable state position according to an exemplary embodiment of the invention. Referring to FIG. 1 and FIG. 2, a standard point SP may be one of the signals S_ref and S_clk. In the convergence process of the equalizer circuit 100, according to the signals S_up and/or S_dn, the standard point SP (e.g., a voltage of the signal S_ref or a sampling clock of the signal S_clk) may be continuously adjusted and eventually converged to be near the center position of the sampling points, so that the numbers of sampling points on both sides of the standard point SP are approximately equal. At this time, the equalizer circuit 100 may be considered as being converged to the preset stable state position with the standard point SP oscillating near the center position of the sampling points.

Figure 3:
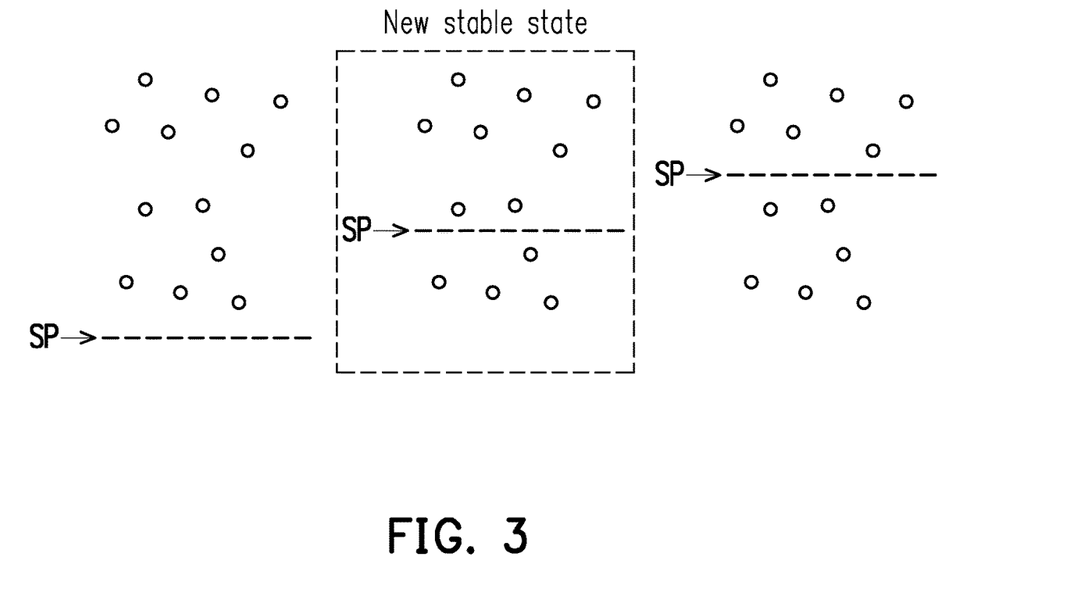
FIG. 3 is a schematic diagram illustrating the equalizer circuit converged to a new stable state position according to an exemplary embodiment of the invention.

FIG. 3 is a schematic diagram illustrating the equalizer circuit converged to a new stable state position according to an exemplary embodiment of the invention. Referring to FIG. 1 and FIG. 3, compared to the exemplary embodiment of FIG. 2, in an exemplary embodiment of FIG. 3, according to the signal S_t, the equalizer circuit 100 leaves the original preset stable state position to be converged to the new stable state position. For example, at the new stable state position, the standard point SP (e.g., the voltage of the signal S_ref or the sampling clock of the signal S_clk) moves to a sampling position where the bit error rate of the signal S_in is higher, and oscillates near that position. At this time, a total of the sampling points on one side (e.g., an upper side) of the standard point SP is significantly more than a total of the sampling points on the other side (e.g., a lower side) of the standard point SP, as shown in FIG. 3.

In an exemplary embodiment, when the equalizer circuit 100 is converged to the new stable state position, the sampling position with the higher bit error rate may be regarded as a signal edge of the signal S_in. This signal edge can reflect an upper edge, a lower edge, a left edge or a right edge of the signal S_in. Therefore, in an exemplary embodiment, a value measured at the new stable state position may be used to evaluate the eye width or the eye height of the signal S_in.

Referring back to FIG. 1, in an exemplary embodiment, the timing feedback circuit 14 may also cut off a signal transmission path of one of the signals S_up and S_dn so that the adjustment control circuit 13 is unable to receive the signal S_up or S_dn generated by the logic processing circuit 12. In this way, the equalizer circuit 100 may leave the preset stable state position to be gradually converged to the new stable state position.

Figure 4:
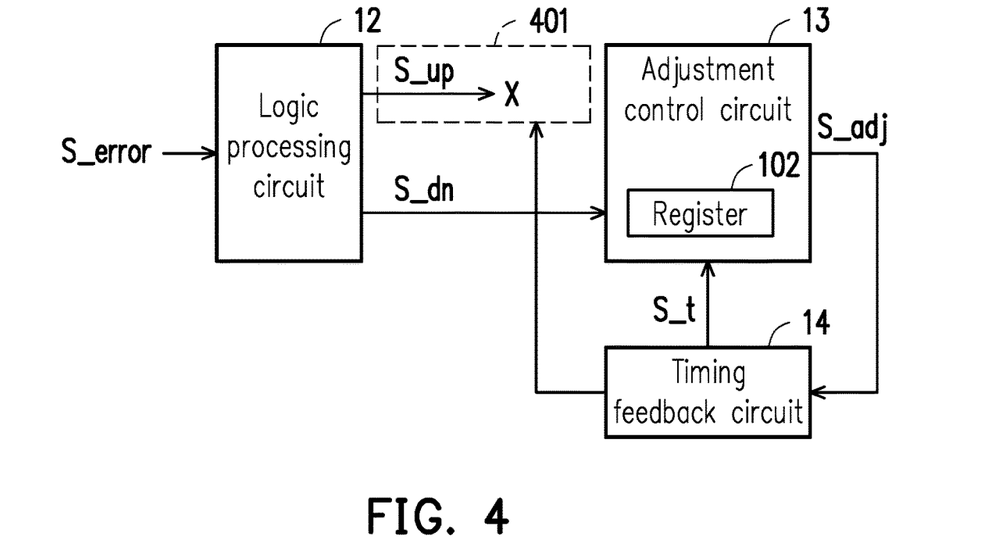
FIG. 4 is a schematic diagram illustrating a signal transmission path of the first adjustment signal being cut off according to an exemplary embodiment of the invention.
Figure 5:
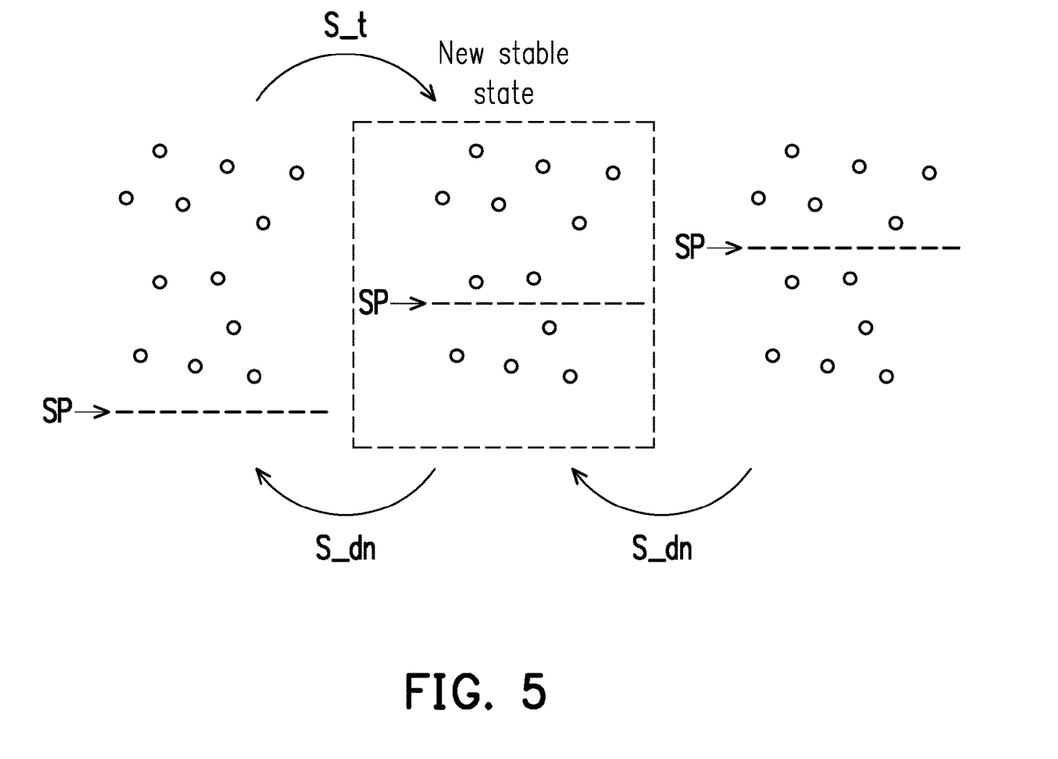
FIG. 5 is a schematic diagram illustrating the equalizer circuit converged to a new stable state position according to an exemplary embodiment of the invention.

FIG. 4 is a schematic diagram illustrating a signal transmission path of the first adjustment signal being cut off according to an exemplary embodiment of the invention. FIG. 5 is a schematic diagram illustrating the equalizer circuit converged to a new stable state position according to an exemplary embodiment of the invention.

Referring to FIG. 4 and FIG. 5, in an exemplary embodiment, the timing feedback circuit 14 may cut off a signal transmission path 401 of the signal S_up between the logic processing circuit 12 and the adjustment control circuit 13. After the signal transmission path 401 is cut off, the logic processing circuit 12 may still normally generate the signals S_up and S_dn, but only the signal S_dn can be received by the adjustment control circuit 13. Therefore, according to the signal S_dn, the value of the control code in the register 102 may be gradually reduced (i.e., updated from the first control code to the second control code). At the same time, under the influence of the continuously decreased control code, the standard point SP may also continue to decline.

On the other hand, the timing feedback circuit 14 may detect a current convergence state of the equalizer circuit 100 or a current value of the control code according to the signal S_adj. If the current convergence state of the equalizer circuit 100 meets a preset condition or the current value of the control code meets a preset value (e.g., less than the preset value), the timing feedback circuit 14 may send the signal S_t to the adjustment control circuit 13. According to the signal S_t, the adjustment control circuit 13 may perform the timing feedback on the control code in the register 102 to restore the value corresponding to the control code to a larger value used a while ago. Therefore, according to this control code, the standard point SP may be raised to a corresponding position in the new stable state position. By analogy, the standard point SP may continue to oscillate up and down near a position with the higher bit error rate according to the signals S_dn and S_t, as shown in FIG. 5.

In an exemplary embodiment, the standard point SP may correspond to a voltage level of the signal S_ref. If the standard point SP rises, it means that the voltage level of the signal S_ref is increased. If the standard point SP drops, it means that the voltage level of the signal S_ref is decreased.

Figure 6:
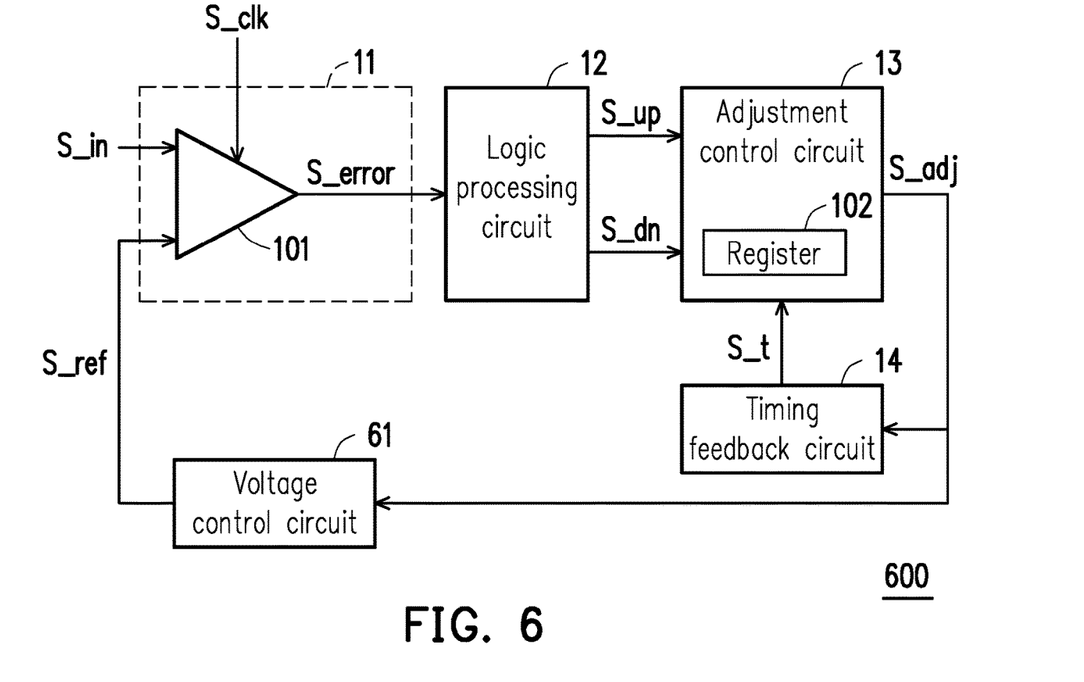
FIG. 6 is a schematic diagram illustrating an equalizer circuit according to an exemplary embodiment of the invention.

FIG. 6 is a schematic diagram illustrating an equalizer circuit according to an exemplary embodiment of the invention. Referring to FIG. 6, in an exemplary embodiment, an equalizer circuit 600 further includes a voltage control circuit 61. The voltage control circuit 61 is coupled to the signal receiving circuit 11 and the timing feedback circuit 14. The voltage control circuit 61 may adjust the signal S_ref according to the signal S_adj.

Taking the example embodiment of FIG. 5 as an example, after controlling the standard point SP (i.e., the signal S_ref) to a corresponding voltage position in the new stable state position, a current voltage level of the signal S_ref may be used to evaluate the eye height of the signal S_in. For example, when the signal S_ref is used to measure the upper edge of the eye of the signal S_in, after controlling the standard point SP (i.e., the signal S_ref) to the corresponding voltage position in the new stable state position, the current voltage level of the signal S_ref may be used as a position of the upper edge of the eye of the signal S_in. Similarly, when the signal S_ref is used to measure the lower edge of the eye of the signal S_in, after controlling the standard point SP (i.e., the signal S_ref) to the corresponding voltage position in the new stable state position, the current voltage level of the signal S_ref may be used as a position of the lower edge of the eye of the signal S_in. A height difference obtained between the position of the upper edge and the position of the lower edge may be regarded as the eye height of the signal S_in.

In an exemplary embodiment, the standard point SP may also correspond to the sampling clock of the signal S_clk. If the standard point SP rises, it means that the sampling clock of the signal S_clk is forward in time. If the standard point SP drops, it means that the sampling clock of the signal S_clk is backward in time.

Figure 7:
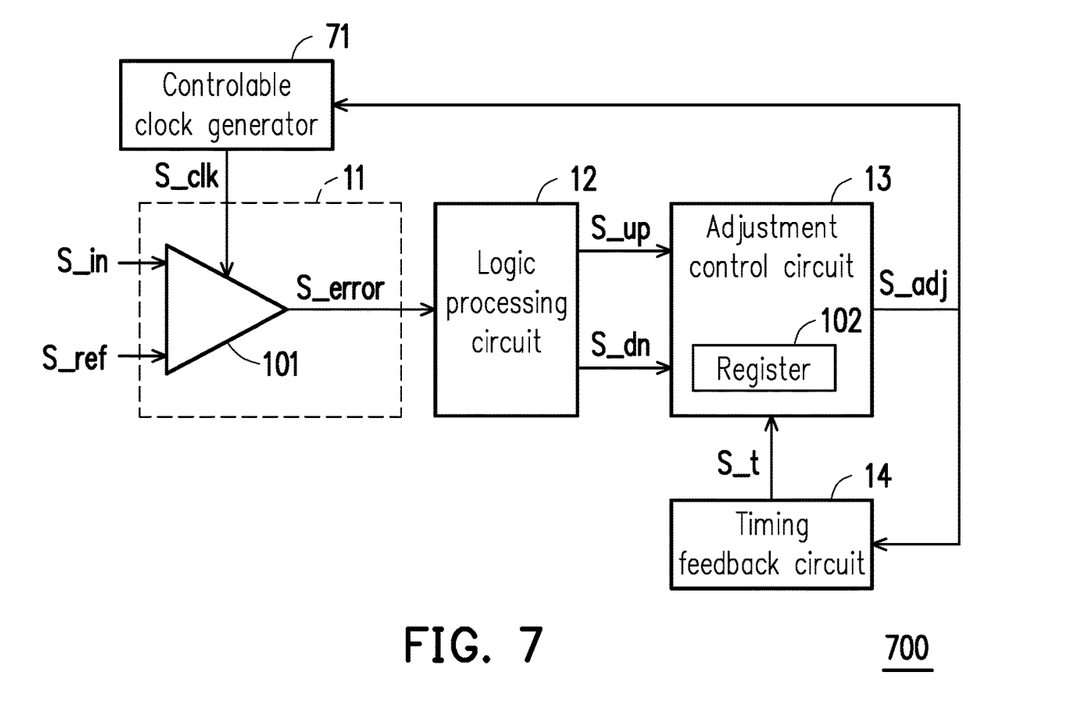
FIG. 7 is a schematic diagram illustrating an equalizer circuit according to an exemplary embodiment of the invention.

FIG. 7 is a schematic diagram illustrating an equalizer circuit according to an exemplary embodiment of the invention. Referring to FIG. 7, in an exemplary embodiment, the equalizer circuit 700 further includes a controllable clock generator 71. The controllable clock generator 71 is coupled to the signal receiving circuit 11 and the timing feedback circuit 14. The controllable clock generator 71 may adjust the signal S_clk according to the signal S_adj. For example, the controllable clock generator 71 may adjust a clock position (e.g., phase) of the signal S_clk according to the signal S_adj.

Also taking the example embodiment of FIG. 5 as an example, after controlling the standard point SP (i.e., the signal S_clk) to a corresponding clock position in the new stable state position, the clock position of the signal S_clk may be used to evaluate the eye width of the signal S_in. For example, when the signal S_clk is used to measure the left edge of the eye of the signal S_in, after controlling the standard point SP (i.e., the signal S_clk) to the corresponding clock position in the new stable state position, the current clock position of the signal S_clk may be used as a position of the left edge of the eye of the signal S_in. Similarly, when the signal S_clk is used to measure the right edge of the eye of the signal S_in, after controlling the standard point SP (i.e., the signal S_clk) to the corresponding clock position in the new stable state position, the current clock position of the signal S_clk may be used as a position of the right edge of the eye of the signal S_in. A time difference obtained between the position of the left edge and the position of the right edge may be regarded as the eye width of the signal S_in.

In an exemplary embodiment, even if an eye width detector and/or an eye height detector are not added to the equalizer circuit 100, 600 or 700, the eye width and/or eye height of the signal S_in may still be measured by directly controlling the equalizer circuit 100, 600 or 700 to the new stable state position. In addition, it should be noted that in the example embodiments of FIG. 4 and FIG. 5, the signal transmission path 401 of the signal S_up is cut off as an example. However, in another exemplary embodiment, a signal transmission path of the signal S_dn may be cut off instead. Alternatively, in another exemplary embodiment, even if the signal transmission paths of the signals S_up and S_dn are not cut off, the control code may still be appropriately adjusted by performing the timing feedback so that the equalizer circuit 100, 600 or 700 may be converged to the new stable state position.

In an exemplary embodiment, the equalizer circuit 100, 600 or 700 may be disposed in the memory storage device to receive the signal S_in from a host system. However, in some other exemplary embodiments, the equalizer circuit 100, 600 or 700 may also be disposed in other types of electronic devices, and is not limited to the memory storage device.

Figure 8:
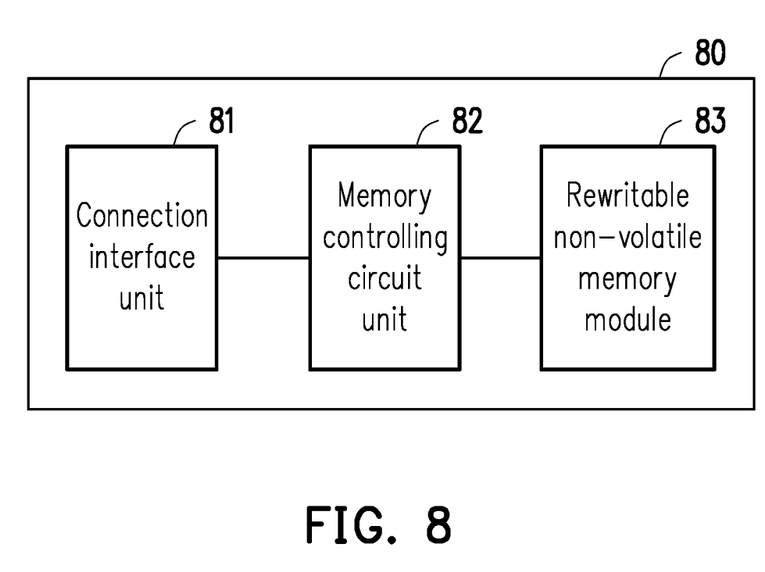
FIG. 8 is a schematic diagram illustrating a memory storage device according to an exemplary embodiment of the invention.

FIG. 8 is a schematic diagram illustrating a memory storage device according to an exemplary embodiment of the invention. Referring to FIG. 8, the memory storage device 80 may be used together with a host system so the host system may write data into the memory storage device 80 or read data from the memory storage device 80. For example, the mentioned host system may be any system capable of substantially cooperating with the memory storage device 80 for storing data, such as a desktop computer, a notebook computer, a digital camera, a video camera, a communication device, an audio player, a video player or a tablet computer.

The memory storage device 80 includes a connection interface unit 81, a memory control circuit unit 82 and a rewritable non-volatile memory module 83. The connection interface unit 81 is configured to connect the memory storage device 80 to the host system. In an exemplary embodiment, the connection interface unit 81 is compatible with a SATA (Serial Advanced Technology Attachment) standard. Nevertheless, it should be understood that the invention is not limited in this regard. The connection interface unit 81 may also be compatible with a PATA (Parallel Advanced Technology Attachment) standard, a PCI Express (Peripheral Component Interconnect Express) interface standard, a USB (Universal Serial Bus) standard or other suitable standards. The connection interface unit 81 may be packaged into one chip with the memory control circuit unit 82, or the connection interface unit 81 may also be distributed outside of a chip containing the memory control circuit unit 82.

The memory control circuit unit 82 is configured to perform operations of writing, reading or erasing data in the rewritable non-volatile memory module 83 according to the control commands. The rewritable non-volatile memory module 83 is coupled to the memory control circuit unit 82 and configured to store data written from the host system. The rewritable non-volatile memory module 83 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quad Level Cell) NAND-type flash memory module (i.e., a flash memory module capable of storing four bits in one memory cell), other flash memory modules or other memory modules having the same features.

In the rewritable non-volatile memory module 83, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". With changes in the threshold voltage, each of the memory cells in the rewritable non-volatile memory module 83 has a plurality of storage states. The storage state to which the memory cell belongs may be determined by applying a read voltage to the memory cell, so as to obtain the one or more bits stored in the memory cell.

In this exemplary embodiment, the memory cells of the rewritable non-volatile memory module 83 may constitute a plurality of physical programming units, and the physical programming units can constitute a plurality of physical erasing units. Specifically, the memory cells on the same word line may constitute one or more of the physical programming units. If each of the memory cells can store two or more bits, the physical programming units on the same word line may be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. In general, in the MLC NAND flash memory, a writing speed of the lower physical programming unit is higher than a writing speed of the upper physical programming unit, and/or a reliability of the lower physical programming unit is higher than a reliability of the upper physical programming unit.

In this exemplary embodiment, the physical programming unit is the minimum unit for programming. That is, the physical programming unit is the minimum unit for writing data. For example, the physical programming unit may be a physical page or a physical sector. If the physical programming unit is the physical page, these physical programming units may include a data bit area and a redundancy bit area. The data bit area contains multiple physical sectors configured to store user data, and the redundant bit area is configured to store system data (e.g., management data such as an error correcting code, etc.). In this exemplary embodiment, the data bit area contains 32 physical sectors, and a size of each physical sector is 512 bytes (B). However, in other exemplary embodiments, the data bit area may also contain 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

In an exemplary embodiment, the rewritable non-volatile memory module 83 of FIG. 8 is also known as a flash memory module. In an exemplary embodiment, the memory control circuit unit 82 of FIG. 8 is also known as a flash memory controller for controlling the flash memory module. In an exemplary embodiment, the equalizer circuit 100, 600 or 700 may be disposed in the connection interface unit 81, the memory control circuit unit 82 and/or the rewritable non-volatile memory module 83, and used to modulate the received signal S_in.

Figure 9:
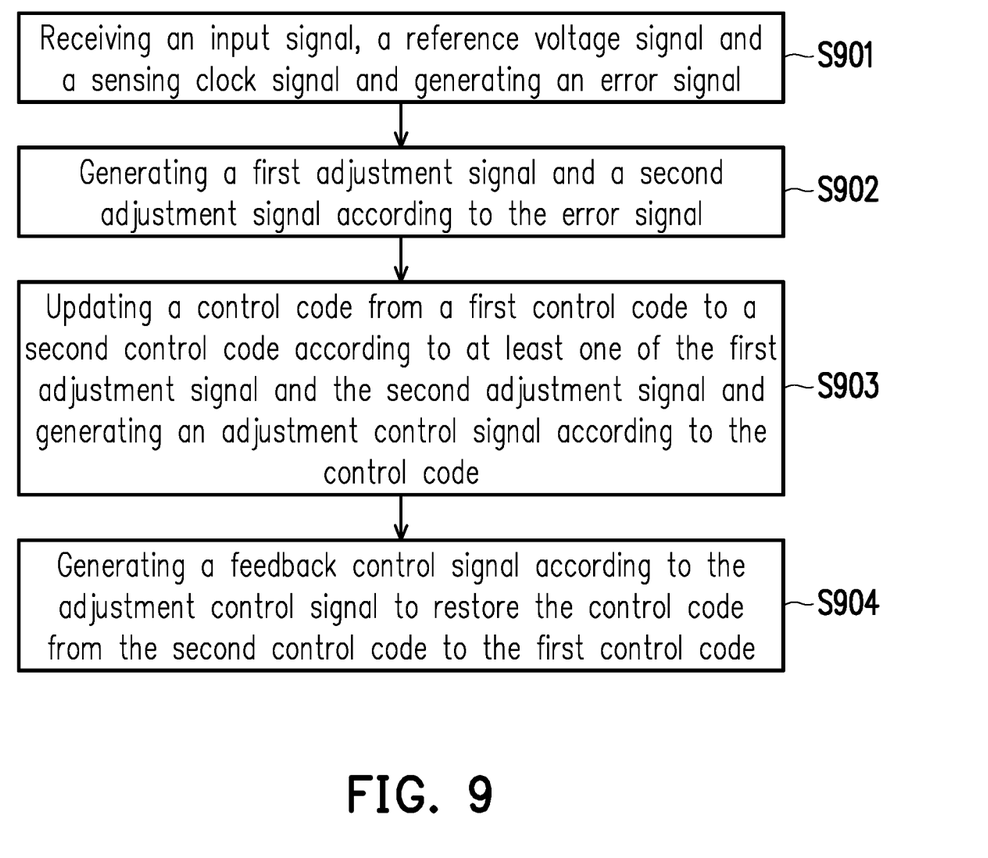
FIG. 9 is a flowchart illustrating a signal adjustment method according to an exemplary embodiment of the invention.

FIG. 9 is a flowchart illustrating a signal adjustment method according to an exemplary embodiment of the invention. Referring to FIG. 9, in step S901, an input signal, a reference voltage signal and a sensing clock signal are received and an error signal is generated. In step S902, a first adjustment signal and a second adjustment signal are generated according to the error signal. In step S903, a control code is updated from a first control code to a second control code according to at least one of the first adjustment signal and the second adjustment signal and an adjustment control signal is generated according to the control code. The adjustment control signal is configured to adjust one of the reference voltage signal and the sensing clock signal, and the first control code is different from the second control code.

In step S904, a feedback control signal is generated according to the adjustment control signal to restore the control code from the second control code to the first control code.

Nevertheless, steps depicted in FIG. 9 are described in detail as above so that related description thereof is omitted hereinafter. It should be noted that, the steps depicted in FIG. 9 may be implemented as a plurality of program codes or circuits, which are not particularly limited in the invention. Moreover, the method disclosed in FIG. 9 may be implemented by reference with above exemplary embodiments, or may be implemented separately, which are not particularly limited in the invention.

In summary, during the convergence process of the equalizer circuit, the feedback control signal is additionally added and used for the timing feedback of the control code generated during the convergence process. Accordingly, the equalizer circuit can stably converge at a place where a signal error is large, and can then use the information measured there for the subsequent application such as the eye height detection and/or the eye wide detection.

The invention claimed is:
1. An equalizer circuit, comprising:
  a signal receiving circuit, configured to receive an input signal, a reference voltage signal and a sensing clock signal and generate an error signal;
  a logic processing circuit, coupled to the signal receiving circuit and configured to generate a first adjustment signal and a second adjustment signal according to the error signal;
  an adjustment control circuit, coupled to the logic processing circuit, and configured to update a control code from a first control code to a second control code according to at least one of the first adjustment signal and the second adjustment signal and generate an adjustment control signal according to the control code, wherein the adjustment control signal is configured to adjust one of the reference voltage signal and the sensing clock signal, and the first control code is different from the second control code; and
  a timing feedback circuit, coupled to the adjustment control circuit and configured to generate a feedback control signal to the adjustment control signal according to the adjustment control signal, so as to instruct the adjustment control circuit to restore the control code from the second control code to the first control code.

2. The equalizer circuit of claim 1, wherein the signal receiving circuit comprises:
  a comparator, coupled to the logic processing circuit,
  wherein the comparator is configured to compare the input signal with the reference voltage signal according to the sensing clock signal and generate the error signal according to a comparison result.

3. The equalizer circuit of claim 1, wherein the first adjustment signal is configured to increase the control code by a first preset value, and the second adjustment signal is configured to decrease the control code by a second preset value.

4. The equalizer circuit of claim 1, wherein the adjustment control circuit comprises:
  a register, coupled to the logic processing circuit,
  wherein the register is configured to store the control code.

5. The equalizer circuit of claim 1, further comprising:
  a voltage control circuit, coupled to the adjustment control circuit and the signal receiving circuit, wherein the voltage control circuit is configured to adjust the reference voltage signal according to the adjustment control signal.

6. The equalizer circuit of claim 1, further comprising:
a controllable clock generator, coupled to the adjustment control circuit and the signal receiving circuit,
wherein the controllable clock generator is configured to adjust the sensing clock signal according to the adjustment control signal.

7. The equalizer circuit of claim 1, wherein the timing feedback circuit is further configured to cut off a signal transmission path of one of the first adjustment signal and the second adjustment signal so that the adjustment control circuit is unable to receive the one of the first adjustment signal and the second adjustment signal.

8. A memory storage device, comprising:
a connection interface unit, configured to couple to a host system;
a rewritable non-volatile memory module;
a memory control circuit unit, coupled to the connection interface unit and the rewritable non-volatile memory module; and
an equalizer circuit, disposed in at least one of the connection interface unit, the rewritable non-volatile memory module and the memory control circuit unit,
wherein the equalizer circuit is configured to receive an input signal, a reference voltage signal and a sensing clock signal and generate an error signal,
the equalizer circuit is further configured to generate a first adjustment signal and a second adjustment signal according to the error signal;
the equalizer circuit is further configured to update a control code from a first control code to a second control code according to at least one of the first adjustment signal and the second adjustment signal and generate an adjustment control signal according to the control code, wherein the adjustment control signal is configured to adjust one of the reference voltage signal and the sensing clock signal, and the first control code is different from the second control code, and
the equalizer circuit is further configured to generate a feedback control signal according to the adjustment control signal to restore the control code from the second control code to the first control code.

9. The memory storage device of claim 8, wherein the equalizer circuit comprises:
a comparator, configured to compare the input signal with the reference voltage signal according to the sensing clock signal and generate the error signal according to a comparison result.

10. The memory storage device of claim 8, wherein the first adjustment signal is configured to increase the control code by a first preset value, and the second adjustment signal is configured to decrease the control code by a second preset value.

11. The memory storage device of claim 8, wherein the equalizer circuit comprises:
a register, configured to store the control code.

12. The memory storage device of claim 8, wherein the equalizer circuit comprises:
a voltage control circuit, configured to adjust the reference voltage signal according to the adjustment control signal.

13. The memory storage device of claim 8, wherein the equalizer circuit comprises:
a controllable clock generator, configured to adjust the sensing clock signal according to the adjustment control signal.

14. The memory storage device of claim 8, wherein the equalizer circuit is further configured to cut off a signal transmission path of one of the first adjustment signal and the second adjustment signal.

15. A signal adjustment method for a memory storage device, the signal adjustment method comprising:
receiving an input signal, a reference voltage signal and a sensing clock signal and generating an error signal;
generating a first adjustment signal and a second adjustment signal according to the error signal;
updating a control code from a first control code to a second control code according to at least one of the first adjustment signal and the second adjustment signal and generating an adjustment control signal according to the control code, wherein the adjustment control signal is configured to adjust one of the reference voltage signal and the sensing clock signal, and the first control code is different from the second control code; and
generating a feedback control signal according to the adjustment control signal to restore the control code from the second control code to the first control code.

16. The signal adjustment method of claim 15, wherein the step of generating the error signal comprises:
comparing the input signal with the reference voltage signal according to the sensing clock signal and generating the error signal according to a comparison result.

17. The signal adjustment method of claim 15, wherein the first adjustment signal is configured to increase the control code by a first preset value, and the second adjustment signal is configured to decrease the control code by a second preset value.

18. The signal adjustment method of claim 15, further comprising:
storing the control code in a register.

19. The signal adjustment method of claim 15, further comprising:
adjusting the reference voltage signal according to the adjustment control signal by a voltage control circuit.

20. The signal adjustment method of claim 15, further comprising:
adjusting the sensing clock signal according to the adjustment control signal by a controllable clock generator.

21. The signal adjustment method of claim 15, further comprising:
cutting off a signal transmission path of one of the first adjustment signal and the second adjustment signal.

\* \* \* \* \*